US008968476B2

(12) United States Patent
Shin et al.

(10) Patent No.: US 8,968,476 B2
(45) Date of Patent: Mar. 3, 2015

(54) ATOMIC LAYER DEPOSITION APPARATUS

(75) Inventors: In Chul Shin, Seoul (KR); Kyung Joon Kim, Gyeongsangbuk-do (KR)

(73) Assignee: K.C. Tech Co., Ltd., Gyeonggi-Do (KR)

( * ) Notice: Subject to any disclaimer, the term of this patent is extended or adjusted under 35 U.S.C. 154(b) by 884 days.

(21) Appl. No.: 12/649,234

(22) Filed: Dec. 29, 2009

(65) Prior Publication Data

US 2010/0186669 A1   Jul. 29, 2010

(30) Foreign Application Priority Data

Dec. 29, 2008 (KR) .................. 10-2008-0135963
May 29, 2009 (KR) .................. 10-2009-0047519

(51) Int. Cl.
| | | |
|---|---|---|
| *C23C 16/00* | (2006.01) | |
| *H01L 21/687* | (2006.01) | |
| *C23C 16/455* | (2006.01) | |
| *H01L 21/677* | (2006.01) | |

(52) U.S. Cl.
CPC .... *H01L 21/68764* (2013.01); *C23C 16/45546* (2013.01); *H01L 21/67742* (2013.01); *H01L 21/67754* (2013.01); *H01L 21/68771* (2013.01)
USPC ....................................................... 118/719

(58) Field of Classification Search
CPC .................. H01L 21/68764; H01L 21/67742; H01L 21/67754; H01L 21/68771; C23C 16/45546
USPC ..................... 156/345, 34, 345.43; 118/719
See application file for complete search history.

(56) References Cited

U.S. PATENT DOCUMENTS

| | | | | |
|---|---|---|---|---|
| 5,444,217 A | * | 8/1995 | Moore et al. ................. | 219/405 |
| 6,183,564 B1 | | 2/2001 | Reynolds et al. | |
| 6,235,634 B1 | * | 5/2001 | White et al. ................. | 438/680 |
| 6,306,216 B1 | * | 10/2001 | Kim et al. .................... | 118/725 |
| 6,319,553 B1 | | 11/2001 | McInerney et al. | |
| 6,342,691 B1 | * | 1/2002 | Johnsgard et al. ............ | 219/390 |
| 6,395,094 B1 | * | 5/2002 | Tanaka et al. ................ | 118/719 |

(Continued)

FOREIGN PATENT DOCUMENTS

| | | |
|---|---|---|
| CN | 101061253 A | 11/2005 |
| JP | 2001-513592 | 9/2001 |

(Continued)

OTHER PUBLICATIONS

English translation JP 2008-016815, Seol, Jan. 2008.*

*Primary Examiner* — Keath Chen
(74) *Attorney, Agent, or Firm* — Marger Johnson & McCollom

(57) ABSTRACT

An atomic deposition apparatus is provided for simultaneously loading/unloading a plurality of substrates. The atomic deposition apparatus which may load/unload the plurality of substrates when transmitting the plurality of substrates to a process module, includes a loading/unloading module for loading/unloading a substrate, a process module including a plurality of process chambers for simultaneously receiving a plurality of substrates and performing a deposition process, each of the plurality of process chambers including a gas spraying unit having an exhaust portion by which an exhaust gas is drawn in from inside the process chamber and the drawn in gas is exhausted above the process chamber, and a transfer module including a transfer robot provided between the loading/unloading module and the process module, the transfer robot being adopted for simultaneously holding the plurality of substrates while transporting the substrate.

20 Claims, 13 Drawing Sheets

(56) References Cited

U.S. PATENT DOCUMENTS

| | | | |
|---|---|---|---|
| 6,530,733 B2 * | 3/2003 | Klein et al. | 414/217 |
| 6,821,563 B2 * | 11/2004 | Yudovsky | 427/248.1 |
| 2001/0009255 A1 * | 7/2001 | Savas | 219/390 |
| 2002/0046705 A1 | 4/2002 | Sandhu et al. | |
| 2003/0035709 A1 * | 2/2003 | Cox et al. | 414/279 |
| 2003/0209324 A1 * | 11/2003 | Fink | 156/345.48 |
| 2004/0013497 A1 | 1/2004 | Shirai | |
| 2004/0058293 A1 | 3/2004 | Nguyen et al. | |
| 2004/0108308 A1 * | 6/2004 | Okajima | 219/468.1 |
| 2006/0039781 A1 * | 2/2006 | Niewmierzycki et al. | 414/217 |
| 2006/0237433 A1 * | 10/2006 | Quach et al. | 219/444.1 |
| 2007/0051312 A1 * | 3/2007 | Sneh | 118/719 |
| 2007/0281089 A1 * | 12/2007 | Heller et al. | 427/255.5 |
| 2008/0026162 A1 * | 1/2008 | Dickey et al. | 427/569 |

FOREIGN PATENT DOCUMENTS

| | | |
|---|---|---|
| JP | 2002-198418 | 12/2002 |
| JP | 2006-165173 | 6/2006 |
| JP | 2008-016815 | 1/2008 |
| JP | 2008-513980 | 5/2008 |
| JP | 2008-135630 | 6/2008 |
| JP | 2009-252050 | 10/2008 |
| JP | 2008-277725 | 11/2008 |
| WO | WO9726117 | 7/1997 |
| WO | 2008100846 A2 | 8/2008 |

* cited by examiner

ATOMIC LAYER DEPOSITION APPARATUS

CROSS-REFERENCE TO RELATED APPLICATIONS

This application claims the benefit of Korean Patent Applications No. 10-2008-0135963, filed on Dec. 29, 2008, and No. 10-2009-0047519, filed on May 29, 2009 in the Korean Intellectual Property Office, the disclosures of which are incorporated herein by reference.

BACKGROUND

1. Field

Exemplary embodiments relate to an atomic layer deposition apparatus, and more particularly, to an atomic layer deposition apparatus that may simultaneously load and unload a plurality of substrates to improve a throughput.

2. Description of the Related Art

In general, to deposit a thin film with a predetermined thickness on a substrate such as a semiconductor substrate, a glass, and the like, there may be used a method of fabricating the thin film utilizing a physical vapor deposition (PVD) using physical collision such as sputtering, a chemical vapor deposition (CVD) using chemical reaction, and the like.

As a design rule of a semiconductor device becomes rapidly minute, a thin film with a minute pattern is required, and a step, on which the thin film is formed, may become significantly great. Accordingly, an atomic layer deposition (ALD) that may significantly and uniformly form a minute pattern with an atomic layer thickness and have excellent step coverage has been increasingly used.

In terms of using chemical reaction between gas molecules, the ALD may be similar to a general CVD. However, unlike the general CVD that may simultaneously inject a plurality of gas molecules into a process chamber, and deposit, on a substrate, a reaction product generated from an upper portion of the substrate, the ALD may inject a single gas element into the process chamber to purge the injected gas element, allow only a physically deposited gas to remain on a surface of a heated substrate, and inject other gas elements into the process chamber to thereby deposit a product of chemical reaction generated on the surface of the substrate. A thin film realized through the ALD may have an excellent step coverage property and a low impurity content and thus, is currently widely used.

As for an existing ALD apparatus, there is disclosed an ALD of a semi-batch type in which a deposition process is simultaneously performed on a plurality of substrates to improve a throughput. In general, the ALD apparatus of the semi-batch type may be performed such that different deposition gases are injected and a substrate sequentially passes through an area where the deposition gases are injected by means of a high-speed rotation of a gas injection unit or susceptor unit, and a product of a chemical reaction between the deposition gases is deposited on the surface of the substrate to thereby form a thin film.

Here, in the existing ALD apparatus, two process chambers of the semi-batch type are provided to perform a deposition process simultaneously with respect to 12 pieces of substrates. The ALD apparatus may include a transfer robot that may transport a substrate from a buffer to the process chamber, and load and unload the substrate on the process chamber. Here, an existing transfer robot may load/unload and transport the substrate one by one, and one transfer robot may be generally provided due to spatial limitations of the ALD apparatus.

However, in the existing ALD apparatus, since one transfer robot serves to load/unload and transport the substrate, a time required for loading/unloading and transporting the 12 pieces of the substrate may be great. When a time is delayed in the transfer robot while loading/unloading and transporting the substrate, a time delay may occur during the deposition process to thereby reduce throughput and productivity. Also, in the buffer, 25 pieces or 50 pieces of substrates are generally stored, however a process module may perform the deposition process with respect to 12 pieces of the substrates, so that extra substrates may remain. As a result, a time required for replacing the buffer and supplementing the substrate may be needed due to treatment of the extra substrates.

SUMMARY

Exemplary embodiments provide an atomic layer deposition apparatus that may prevent a time delay occurring when loading/unloading and transporting a substrate.

Exemplary embodiments also provide an atomic layer deposition apparatus that may improve a throughput and productivity of a deposition process.

According to some exemplary embodiments, there is provided an atomic layer deposition apparatus, which enables to load/unload a plurality of substrates when moving the plurality of substrates to a process module, the apparatus including: a loading/unloading module for loading/unloading a substrate; a process module including a plurality of process chambers for simultaneously receiving a plurality of substrates and performing a deposition process, each of the plurality of process chambers including a gas spraying unit having an exhaust portion by which an exhaust gas is drawn in from inside the process chamber and the drawn-in gas is exhausted above the process chamber; and a transfer module including a transfer robot provided between the loading/unloading module and the process module, the transfer robot being adopted for simultaneously holding the plurality of substrates while transporting the substrate.

The loading/unloading module may include a load port where the plurality of substrates are stored and a buffer, and, when loading the substrate, the buffer provides the same number of substrates as a number of substrates that are lacking so that a number of substrates stored in the load port and a number of substrates received in the process chamber are in multiples of each other. That is, the buffer may provide the same number of substrates as a number of substrates that are lacking in the load port when loading the substrate, thereby preventing extra substrates from being generated in the load port. For example, the buffer may be provided in a side of the transfer module, and an internal pressure of the buffer may be selectively decompressed/pressurized to prevent a vacuum state of the transfer module from being broken when transporting the substrate to the transfer module.

Also, the transfer robot may include a plurality of handling arms, each for holding a single piece of the substrates, and the plurality of handling arms may be formed into a bar-shape or a ring-shape, each having a predetermined width and traversing a center portion of the substrate to correspond to a diameter of the substrate, so that the substrate is supported from a lower portion of the substrate. Here, the handling arms may prevent occurrence of interference between the handling arms with the lift pin or other structures when loading the substrate. Here, the plurality of handling arms of the transfer robot are vertically overlapped when transporting the substrates, and laterally expanded in a 'V-shape' when loading/unloading the substrates on the process chamber.

Also, the transfer module may include a sensor for checking whether the substrate is securely seated on the transfer robot, and the sensor checks whether the substrate is securely seated on the transfer robot in a state where the handling arms are laterally expanded in the 'V-shape' to allow the substrates to be partially overlapped. For example, the sensor may be provided in a lower portion of the transfer module, and may include an optical sensor of checking whether the substrate is securely seated by irradiating a light to the substrate seated on the handling arms.

Also, the process chamber may include a susceptor unit rotatably provided to allow the plurality of substrates to be laterally seated/supported and revolved, and being vertically movable in the process chamber; the gas spraying unit provided on an upper portion of the susceptor unit and including a plurality of spraying regions having at least one source region where a source gas is sprayed and at least one purge region where a purge gas is sprayed, the plurality of spraying regions being defined as a plurality of spraying hole groups by which a single gas of gases used to deposit a thin film on the substrate is provided; the exhaust portion provided on the gas spraying unit and adopted for drawing in the exhaust gas in the process chamber and exhausting the drawn-in gas; a heater unit provided on a lower portion of the susceptor unit and adopted for heating the substrate and the susceptor unit; and a lift pin provided on the susceptor unit to allow the substrate to be seated on the lift pin, and the lift pin being vertically movable to be protruded to the upper portion of the susceptor unit by means of a vertical movement of the susceptor unit.

Here, the exhaust portion may include an exhaust line provided along a boundary of the plurality of spraying regions in the gas spraying unit, and defined as a plurality of exhaust hole groups by which the exhaust gas in the process chamber is drawn in and exhausted; and a center exhaust block formed in a center portion of the gas spraying unit and connected with the exhaust line, the center exhaust block being adopted for drawing in and exhausting an exhaust gas in a center portion of the susceptor unit.

Also, the exhaust portion may include at least two exhaust lines formed to exhaust an exhaust gas drawn in from each of the at least one source region through different exhaust buffers of the at least two exhaust lines.

Also, the exhaust line may be formed such that the exhaust gas drawn in from one of the at least one source region and an exhaust gas drawn in from one of the at least one purge region are exhausted through an identical single exhaust buffer.

Also, the center exhaust block may include an exhaust path for exhausting an exhaust gas drawn in from the center exhaust block, and the exhaust path may be connected with or disconnected from an exhaust buffer.

Also, the center exhaust block may have a region having a size corresponding to that of the center portion of the susceptor unit.

Also, the center exhaust block may be formed such that an exhaust gas from each of the at least one source region is exhausted through different exhaust paths.

Also, the exhaust line may further include an auxiliary exhaust block formed thereon to traverse the plurality of spraying regions, and the auxiliary exhaust block may include an exhaust path for exhausting an exhaust gas drawn in from the auxiliary exhaust block, the exhaust path being connected with the exhaust line and the center exhaust block, or being formed separately from the exhaust line and the center exhaust block.

Also, the lift pin may be formed in such a manner as to pass through the susceptor unit and to be extended to the lower portion of the susceptor unit, and a lower end of the lift pin may be brought into contact with the heater unit when the susceptor unit descends, so that the lift pin is protruded to the upper portion of the susceptor unit, and the lift pin descends by its unladen weight when the susceptor unit ascends.

Also, the heater unit may include a pin guide hole for receiving the lower end of the lift pin when the susceptor unit descends to prevent the lift pin from being protruded, and the pin guide hole may receive the lift pin of seated positions corresponding to remaining substrates excluding two pieces of loaded/unloaded substrates when the susceptor unit descends. That is, since the lift pin of the seated locations may not be protruded when loading/unloading the substrate, the substrate may be maintained in a state of being seated on the susceptor unit, and the lift pin of loaded positions may be protruded, and thereby the substrate may be seated on the lift pin.

Also, since the handling arms may be formed to transport the substrate in a state where the handling arms are vertically overlapped, a difference in heights of the substrate seated on the handling arms when loading/unloading the substrate may be generated. Also, the lift pin of loaded positions corresponding to two pieces of loaded/unloaded substrates may be protruded in heights different from one another to correspond to a difference in heights where the substrate is loaded/unloaded.

Also, the heater unit may include a heating element of a wire type or a filament type embedded in the heater unit for generating a heat when a power is applied in a sealed interior of a housing of the heater unit.

Also, the heater unit may include a single or a plurality of heating elements of the heater unit disposed in a curved line-shape, so that a plurality of heating regions is created in locations corresponding to the plurality of substrates.

Here, the housing of the heater unit may prevent a heat generated in the heating element from being emitted to a lower portion of the heater unit. Also, the housing of the heater unit may include a shielding member formed in a lower portion of the housing, for preventing the heat generated in the heating element from being emitted to the lower portion of the heater unit.

EFFECT

As described above, according to exemplary embodiments, a transfer robot including a plurality of handling arms may be provided to simultaneously transport and load/unload at least two substrates, thereby effectively reducing a time required for transporting and loading/unloading the substrate, and preventing a time delay occurring in the transfer robot.

Also, according to exemplary embodiments, a buffer may be provided to prevent some substrates from remaining on a load port when loading/unloading the substrates due to a number of substrates accommodated in the load port and a number of substrates simultaneously accommodated in a process chamber, and to prevent a process from being delayed due to treatment of extra substrates.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
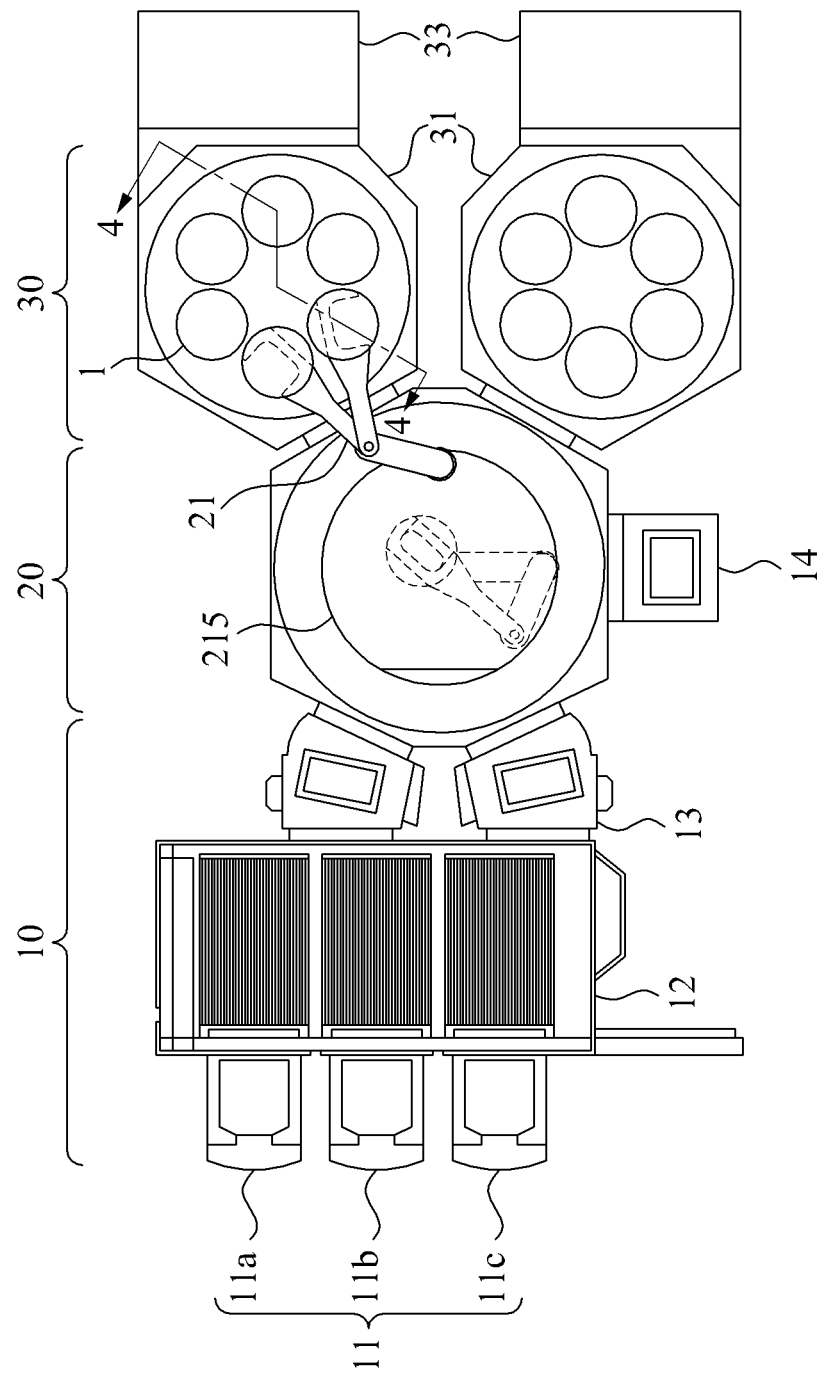
FIG. 1 is a plane view illustrating an entire system of an atomic layer deposition apparatus according to exemplary embodiments herein.

Reference will now be made in detail to exemplary embodiments, examples of which are illustrated in the accompanying drawings, wherein like reference numerals refer to the like elements throughout. Exemplary embodiments are described below to explain the present disclosure by referring to the figures.

Hereinafter, an atomic layer deposition apparatus according to exemplary embodiments will be described in detail with reference to FIGS. 1 to 14.

An entire system of the atomic layer deposition apparatus will be described in detail with reference to FIG. 1. FIG. 1 is a plane view illustrating an entire system of an atomic layer deposition apparatus according to an exemplary embodiment.

Referring to FIG. 1, the atomic layer deposition apparatus includes a loading/unloading module 10 for loading/unloading a substrate 1 on the atomic layer deposition apparatus, a process module 30 where a deposition process of an atomic layer is performed, and a transfer module 20 formed between the loading/unloading module 10 and the process module 30, for transferring the substrate 1.

Here, without limitation, the substrate 1 for example may be a silicon wafer. That is, the substrate 1 may be a transparent substrate including a glass used for a flat display apparatus such as a liquid crystal display (LCD) and a plasma display panel (PDP). Also, a shape and type of the substrate 1 may not be limited to embodiments as shown in the accompanying drawings and thus, the substrate 1 may practically have various shapes and sizes such as a circle, a rectangle, and the like.

The loading/unloading module 10 may include a component for loading/unloading the substrate 1 on the atomic layer deposition apparatus, and components for storing and receiving the substrate 1. For example, the loading/unloading module 10 may include a load port 11 where a plurality of substrates 1 are received and stored, a load buffer unit 12 for temporality receiving the substrates 1 before drawing out the substrates 1 from the load port 11 and transporting the substrates 1 to the transfer module 20, and a load-lock unit 13 provided between the load buffer unit 12 and the transfer module 20 and adopted for decompressing/pressurizing an interior of the atomic layer deposition apparatus while preventing the interior of the atomic layer deposition apparatus from being rapidly changed due to inflow of outside air.

Here, detailed technical configurations of respective components of the loading/unloading unit 10 are not central. Thus, descriptions and drawings describing technical configurations of respective components of the loading/unloading unit 10 are omitted.

For example, the load port 11 may be a device where the plurality of substrates are received and stored, and may be a cassette or a front opening unified pod (FOUP). Also, since the process module 10 simultaneously performs the deposition process with respect to the plurality of substrates 1, the loading/unloading module 10 may include a plurality of load ports 11a, 11b, and 11c.

The load buffer unit 12 may draw out the substrates 1 from the load port 11, and transport the substrates 1 to the load-lock unit 13. The load-lock unit 13 may transport the substrates 1 to the load port 11 and the load port 11 may receive the substrates 1. Here, the load buffer unit 12 may include a robot (not illustrated) for drawing out/receiving the substrates 1 from the load port 11 and the load-lock unit 13 and transporting the substrates 1, and an aligner (not illustrated) for aligning the substrates 1 when drawing out/receiving the substrates 1.

In addition, since an interior of the process module 30 is maintained in a state of a high-vacuum due to characteristics of the deposition process of the atomic layer, a high-vacuum state of the transfer module 20 similar to that of the process module 30 may be maintained to transport the substrates 1 to the process module 30. Through a high-vacuum environment of the transfer module 30, the transfer module 20 may be communicated with an atmosphere when the substrates 1 are loaded/unloaded in the loading/unloading unit 10, and thereby a vacuum state of the transfer module 20 may be broken, and an internal environment of the transfer module 20 and the process module 30 may be rapidly changed. Also, the interior of the transfer module 20 and the process module 30 may be required to be in the high-vacuum state in order to perform the deposition process of the atomic layer after loading/unloading the substrates 1, so that the deposition process may be delayed, causing occurrence of defectives. The load-lock unit 13 may be formed to be selectively communicated with the loading/unloading module 10 and the transfer module 20 or to be sealed/blocked, and also to decompress/pressurize an internal pressure of the load-lock unit 13 to match with the loading/unloading module 10 and the transfer module 20, so that the load-lock unit 13 may transport the substrates 1 between the loading/unloading module 10 and the transfer module 20, while preventing a vacuum state of the transfer module 20 from being broken. Also, a space communicated with the atmosphere when loading/unloading the substrates 1 may be restricted by the load-lock unit 13, and thereby may prevent occurrence of a time delay at the time of the decompressing/pressurizing.

The transfer module 20 may include a transfer module 21 for simultaneously transporting the plurality of substrates. A detailed technical configuration of the transfer robot 21 will be described later with reference to FIGS. 2 to 3.

The process module 30 may include a process chamber 31 where the substrates 1 are received to perform the deposition process, and a deposition gas providing unit 33 for providing a deposition gas to the process chamber 31. For example, the process module 30 may include two process chambers 31 where six pieces of substrates 1 are received, respectively, so that the deposition process may be simultaneously performed with respect to 12 pieces of the substrates 1. However, embodiments described herein are not limited thereto and thus, a number of substrates 1 enabled to be simultaneously processed in the process module 30 and a type of the process module 30 may be practically changed in a variety manner.

In addition, when the number of substrates 1 in which the deposition process is simultaneously performed in the process module 30 and a number of substrates 1 provided in the load port 11 are not in multiples of each other, some substrates 1 may remain or be lacking in the load port 11. According to the present exemplary embodiment, a buffer 14 may be provided in a side of the transfer module 20. In this instance, the buffer 14 may enable the number of substrates 1 of the load port 11 and a number of substrates 1 of the process chamber 31 to be in multiples of each other when loading/unloading the substrates 1, thereby preventing some substrates 1 from remaining or be lacking in the load port 11.

The buffer 14 may be a device where the plurality of substrates 1 are received and stored, similar to the load port 11, and may be provided in the side of the transfer module 20, so that the transfer robot 21 draws out the substrates 1 from the buffer 14. Also, the buffer 14 may selectively decompress/pressurize an internal pressure of the buffer 14, similar to the load-lock unit 13, and thereby may prevent a vacuum state of the transfer module 20 from being broken when transporting the substrates 1. Also, the buffer 14 may selectively seal a connection portion with the transfer module 20.

A method of loading the substrates 1 in the atomic layer deposition apparatus will be herein described in detail. For example, as illustrated in FIG. 1, the process module 30 may simultaneously receive 12 pieces of substrates 1, and the load port 11 may include three load ports 11a, 11b, and 11c where 25 pieces of substrates 1 are respectively stored. The transfer robot 21 may simultaneously transport two pieces of substrates 1 to load the substrates 1 on two process chambers 31, respectively.

In this case, the load buffer unit 12 may draw out two substrates 1 from each of first to third ports 11a, 11b, and 11c, and the load-lock unit 13 may load, one by one, the substrates drawn out from the load buffer unit 12, on the transfer robot 21. Here, the loading/unloading module 10 may include two load-lock units 13 to thereby load a single piece of the substrates 1 on each of two handling arms 211 and 212 of the transfer robot 21, and the transfer robot 21 may simultaneously load two pieces of the substrates 1 on each of two process chambers 31 in a sequential manner.

In this manner, when the substrates 1 are drawn out from the load port 11, two pieces of the substrates 1 are drawn out from each of the load ports 11a, 11b, and 11c twelve times and thus, a single piece of the substrate 1 may remain in each of the load ports. The remaining substrates 1 may be replenished in the process chamber 31 by drawing out the substrates 1 received in the buffer 14.

According to the present exemplary embodiment, the buffer 14 may function to prevent generation of extra substrates 1 in the load port 11 occurring when the number of substrates 1 received in the process module 30 and the number of substrates 1 stored in the loading/unloading module 10 are not in multiples of each other, and also prevent a delay of the process occurring when supplementing the substrates 1 to thereby improve a throughput.

However, embodiments as illustrated in the accompanying drawings are non-limiting and thus, the number of substrates 1 received in the process chamber 31, a number of the load ports 11, a number of the buffers 14, and a number of substrates 1 received in the buffer 14 may be practically changed in a variety of manners.

Hereinafter, the transfer module 20 and the transfer robot 21 will be described in detail with reference to FIGS. 2 and 3. For reference, FIGS. 2 and 3 are used for describing a detection operation concerning whether the substrate 1 is securely seated in the transfer module 20 of the atomic deposition apparatus of FIG. 1.

Figure 2:
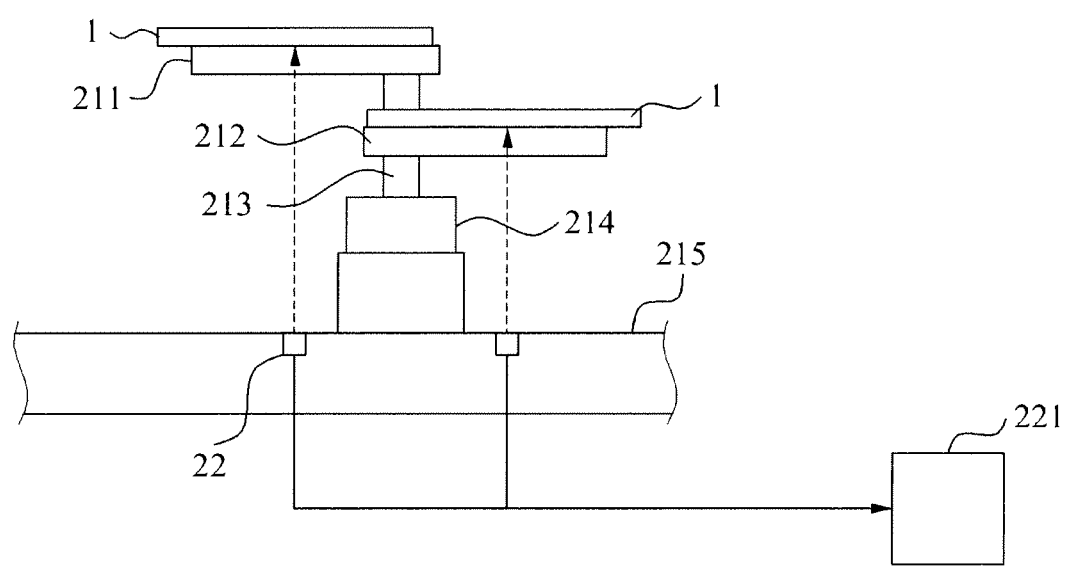
FIG. 2 is a front view illustrating a transfer robot according to exemplary embodiments herein.
Figure 3:
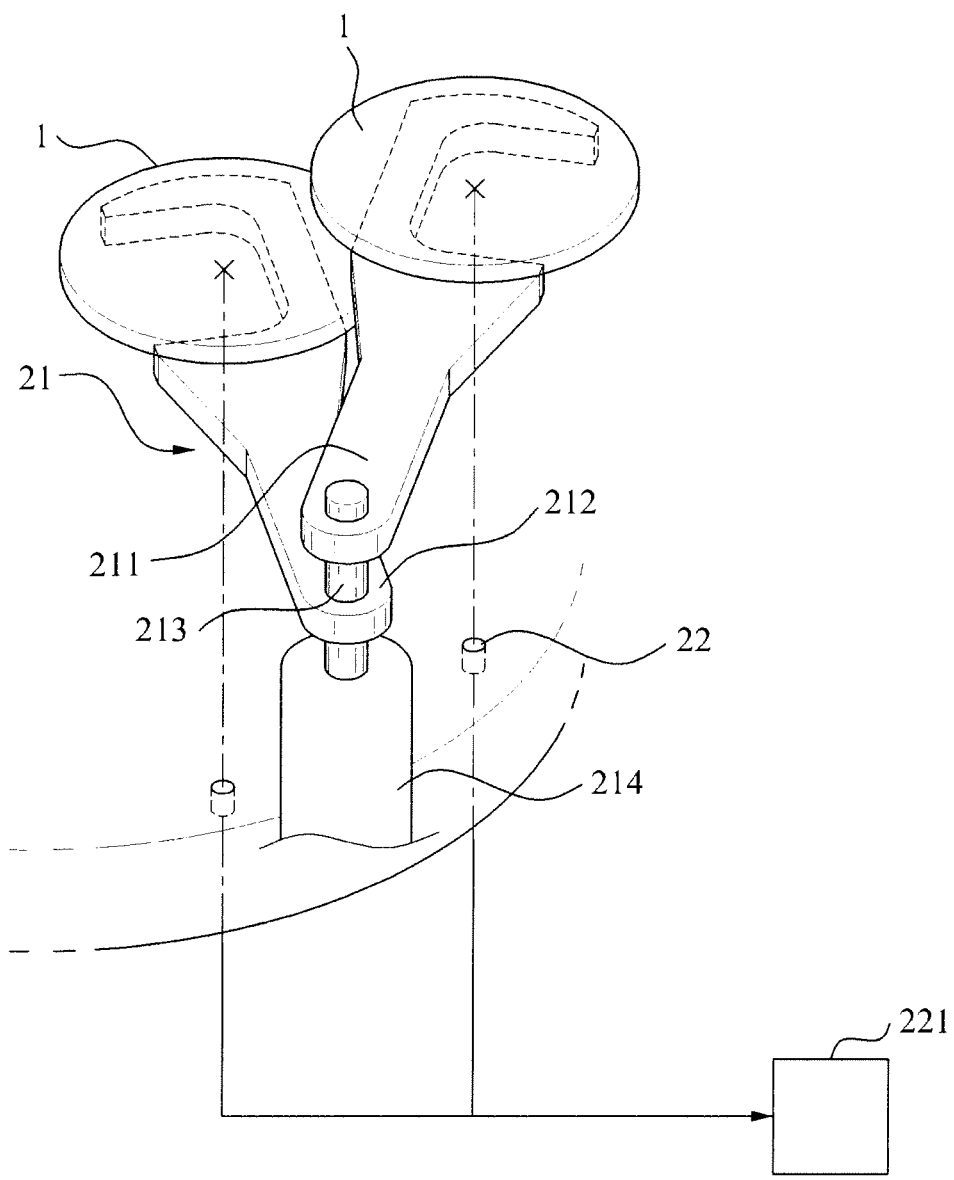
FIG. 3 is a perspective view illustrating a main part of the transfer robot of FIG. 2.

FIG. 2 is a front view illustrating the transfer robot 21 according to exemplary embodiments, and FIG. 3 is a perspective view illustrating a main part of the transfer robot 21 of FIG. 2.

Hereinafter, for convenience of descriptions, the transfer robot 21 enabling simultaneous transport of two pieces of the substrates 1 will be exemplarily described. However, while the transfer robot 21 enabling simultaneous transporting of at least two pieces of substrates 1 may be practically adopted, the embodiments herein are not limited thereto.

Referring to FIGS. 2 and 3, the transfer robot 21 may include handling arms 211 and 212 for simultaneously transporting two pieces of substrates 1, driving arms 213 and 214 for driving the handling arms 211 and 212 to be moved linearly, rotatively, and vertically, and a driving portion 215.

The handling arms 211 and 212 may hold the substrates 1 from a lower portion of the substrates 1, and transport the substrates 1. In this instance, the handling arms 211 and 212 may have a length corresponding to a diameter of the substrates 1 and a predetermined width and size, and thereby may securely hold the substrates. Also, the handling arms 211 and 212 may be formed into a shape by which interference with a lift pin 321 are not generated when loading/unloading the substrates 1, while securely supporting the lower portion of the substrates 1. For example, the handling arms 211 and 212 may be formed into a loop-shape such as 'C-shape' or '⊏-shape'. However, the respective shapes of the transfer robot 21 and the handling arms 211 and 212 are not restricted as illustrated in the accompanying drawings and thus, various shapes of the handling arms 211 and 212 enabling to contact and support the lower portion and edges of the substrates 1 may be practically given.

The driving arms 213 and 214 and the driving portion 215 may be connected with the handling arms 211 and 212 to enable the handling arms 211 and 212 to be moved linearly, rotatively, and vertically, and may supply and transmit a driving power required for driving the handling arms 211 and 212.

In addition, as for the handling arms 211 and 212 enabling to simultaneously transport two pieces of the substrates 1, as a size of the substrate 1 increases, a size of each of the transfer module 20 and the transfer robot 21 may increase, and a size of a space required for operations of the transfer robot 21 may also increase. According to the present exemplary embodiment, to reduce the size of each of the transfer robot 21 and the transfer module 20, the handling arms 211 and 212 may be formed to be vertically spaced apart from each other by a predetermined interval. Accordingly, when transporting the substrates 1, the handling arms 211 and 212 are moved in parallel in a state of being vertically overlapped, and when loading/unloading the substrates 1, the handling arms 211 and 212 are laterally rotated by a predetermined angle, to be expanded in a 'V-shape' as illustrated in FIG. 3.

Also, the transfer module 20 may include a sensor 22 for checking whether two pieces of the substrates 1 are securely seated on the transfer robot 21. Here, since it is difficult to check whether the two pieces of the substrates 1 are securely seated on the transfer robot 21 in a state where the handling arms 211 and 212 are overlapped when transporting the substrates 1, the handling arms 211 and 212 may be required to be laterally rotated by a predetermined angle at the time of the checking of the sensor 22, so that the two pieces of the substrates are partially overlapped.

For example, as illustrated in FIGS. 2 and 3, the sensor 22 may include two optical sensors where a light is irradiated towards the substrates 1 seated on the handling arms 211 and 212 from a location where the substrates 1 are not overlapped and an interference does not occur by the handling arms 211 and 212. Here, when the light is irradiated from the sensor 22, a sensor controlling portion 221 may generate a failure signal to stop the process, in a case where any one of the two pieces of the substrates 1 are not securely seated on the handling arms 211 and 212.

However, embodiments as illustrated in the accompanying drawings are non-limiting and thus, a location and number of the sensor 22 may be practically and diversely changed. Also, as the sensor 22, various means for checking whether the substrates 1 are securely seated on the handling arms 211 and 212, other than the optical sensor, may be used.

Hereinafter, the process module 30 will be described in detail with reference to FIGS. 4 to 14.

Figure 4:
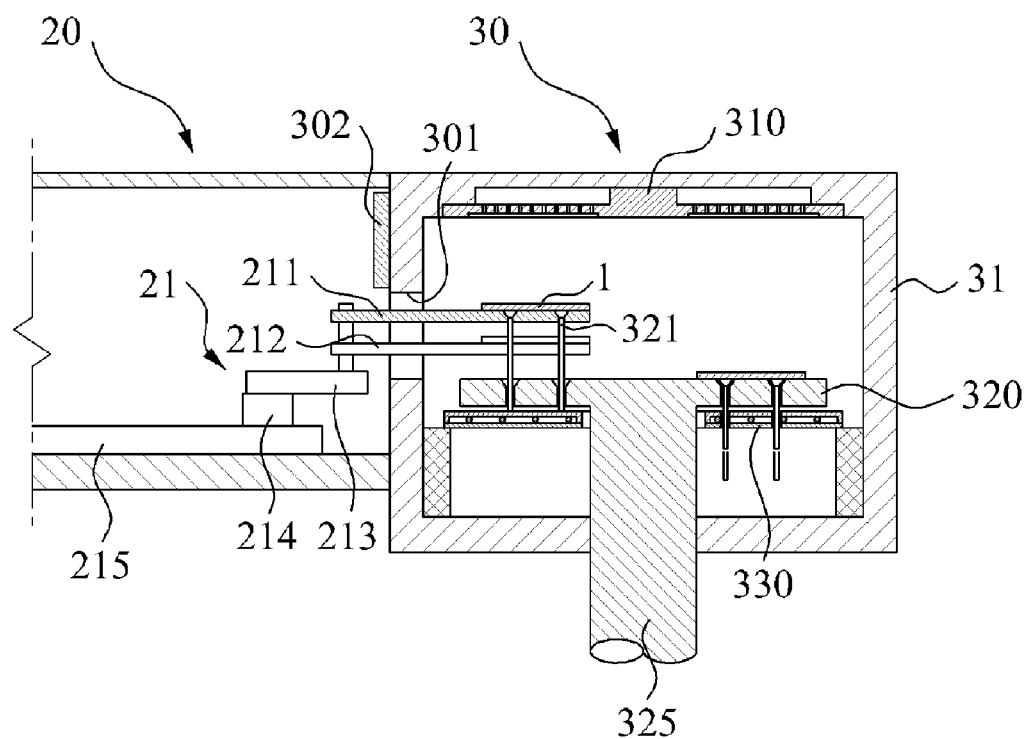
FIG. 4 is a cross-sectional projection view taken along projection line 4-4 in FIG. 1 illustrating the atomic layer deposition apparatus of FIG. 1.
Figure 10:
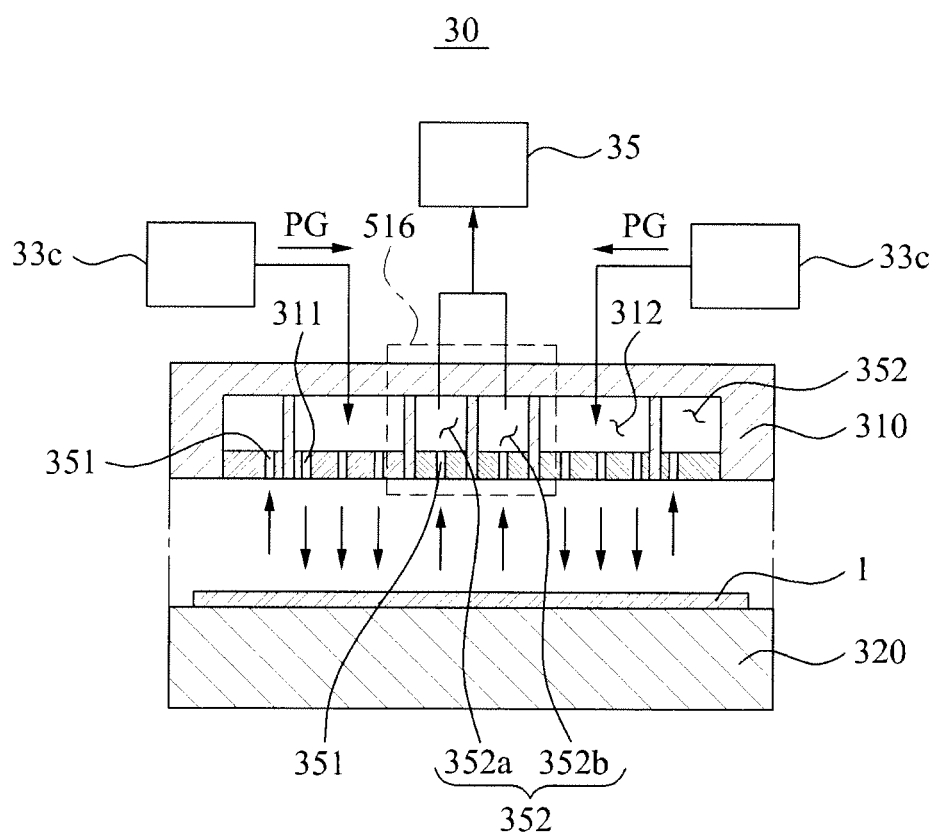
FIG. 10 is a cross-sectional view taken along line III-III in the gas spraying unit of FIG. 8.

FIG. 4 is a cross-sectional view illustrating a part of the process module 30 and the transfer module in the atomic layer deposition apparatus of FIG. 1, and FIG. 10 is a perspective view of a main part of the process module 30 of the atomic layer deposition apparatus of FIG. 4. FIG. 4 shows the long lift pins at the loaded positions 332a (e.g. left side) of FIG. 4 in the foreground and thus blocking the view of the shorter lift pins behind them; and that the shorter lift pins at the seated positions 332b (e.g. right side) of FIG. 4 are shown in the foreground with the longer lift pins behind.

The process module 30 includes two process chambers 31 where six pieces of the substrates 1 are received to perform the deposition process. The process chamber 31 includes a susceptor unit 320 on which the substrate 1 is seated, a gas spraying unit 310 for providing a deposition gas to the substrates 1, and a heater unit 330 for heating the substrates 1 and the susceptor unit 320 for the purpose of the deposition process. Here, a detailed technical configuration of the process module 30 is not an aspect of the present invention. Thus, descriptions and drawings describing technical configurations of respective components of the process module 30 will be omitted.

In addition, a doorway 301 where the transfer robot 21 is moved outward or inward when loading/unloading the substrates 1, and a door 302 for opening/closing the doorway 301 are illustrated in FIG. 4. That is, the doorway 301 may be opened by the door 302 when loading/unloading the substrates 1, as illustrated in FIG. 4, to thereby allow the transfer robot 21 to be moved inward or outward, and the doorway 31 may be closed by the door 302 while performing the deposition process, thereby sealing the process chamber 31.

The gas spraying unit 310 may be provided on an upper portion of the process chamber 31, and provide the deposition gas to the substrates 1 supported by the susceptor unit 320.

Here, a method of depositing the atomic layer may be performed such that different deposition gases including a source material used for forming a thin film are reacted on a surface of the substrates 1 to form a thin film having a predetermined thickness. However, according to the present exemplary embodiment, the gas spraying unit 310 may be fixed, and the susceptor unit 320 may be rotatably provided in parallel with the gas spraying unit 310. The gas spraying unit 310 may include a plurality of spraying regions 400 (see FIG. 6) by which the deposition gases are sequentially sprayed on the substrates 1 while the susceptor unit 320 is rotated, and an exhaust portion 350 for drawing in an exhaust gas from inside the process chamber 31 and exhausting the drawn in gas above the process chamber 31.

For reference, the deposition gases of the present invention may designate gases used in a process of depositing the thin film, and include at least one source gas including a source material constituting the thin film intended to be deposited on the substrates 1, and at least one purge gas for purging the source gas from the substrates 1. According to the present exemplary embodiment, two source gases that are mutually chemically reacted to form the thin film and one purge gas for purging the source gas may be used. For example, as a first source gas (S1) for depositing a silicon thin film, one of silane ($SiH_4$) or disilane ($Si_2H_6$) each including silicon, $SiF_4$ and a metal organic chemical compound, and as a second source gas (S2), a reactive gas decomposed by $O_2$ or $O_3$ and plasma may be used. As the purge gas (PG), a stable gas that is not chemically reacted with the first and second source gases S1 and S2 and the thin film deposited on the substrates 1 may be used, and for example, gases such as argon (Ar), nitrogen ($N_2$), helium (He) may be used alone or in a mixture of two or more. However, the embodiments herein are not limited thereto and thus, a number and type of the deposition gases may be practically and diversely changed.

The gas spraying unit 310 will be described in detail with reference to FIGS. 6 to 10.

Figure 5:
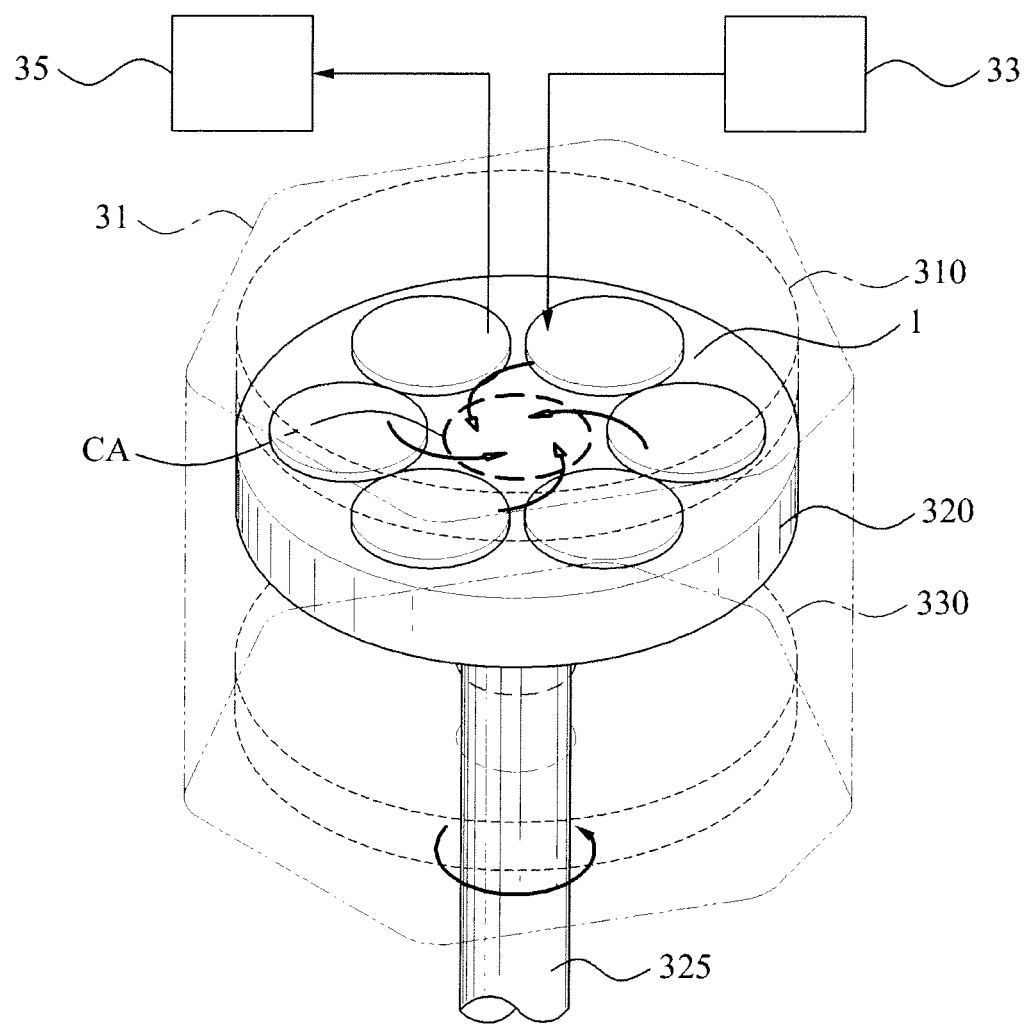
FIG. 5 is a perspective view of a main part of a process module of the atomic layer deposition apparatus of FIG. 4.
Figure 6:
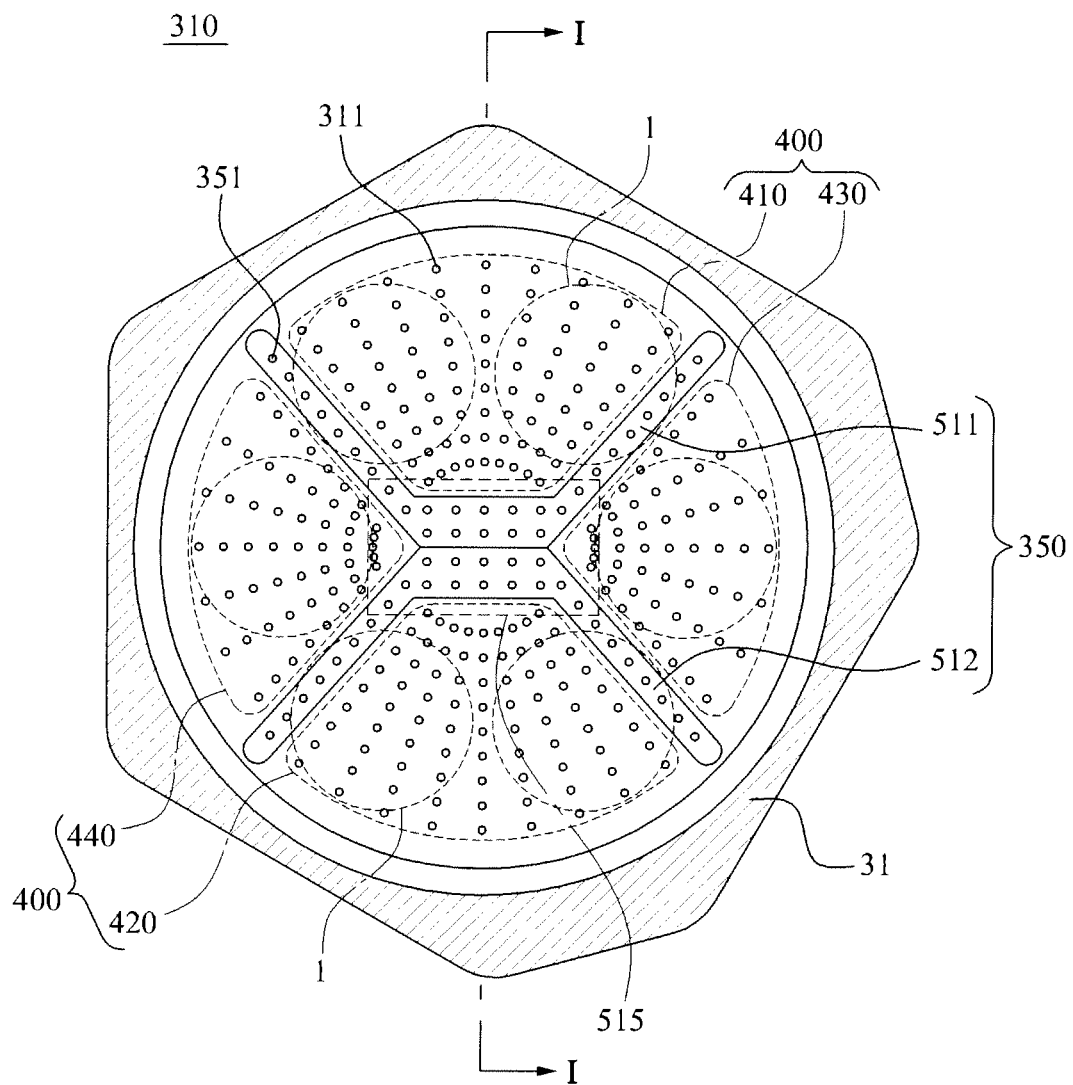
FIG. 6 is a plane view illustrating a gas spraying unit in the process module of FIG. 5.
Figure 7:
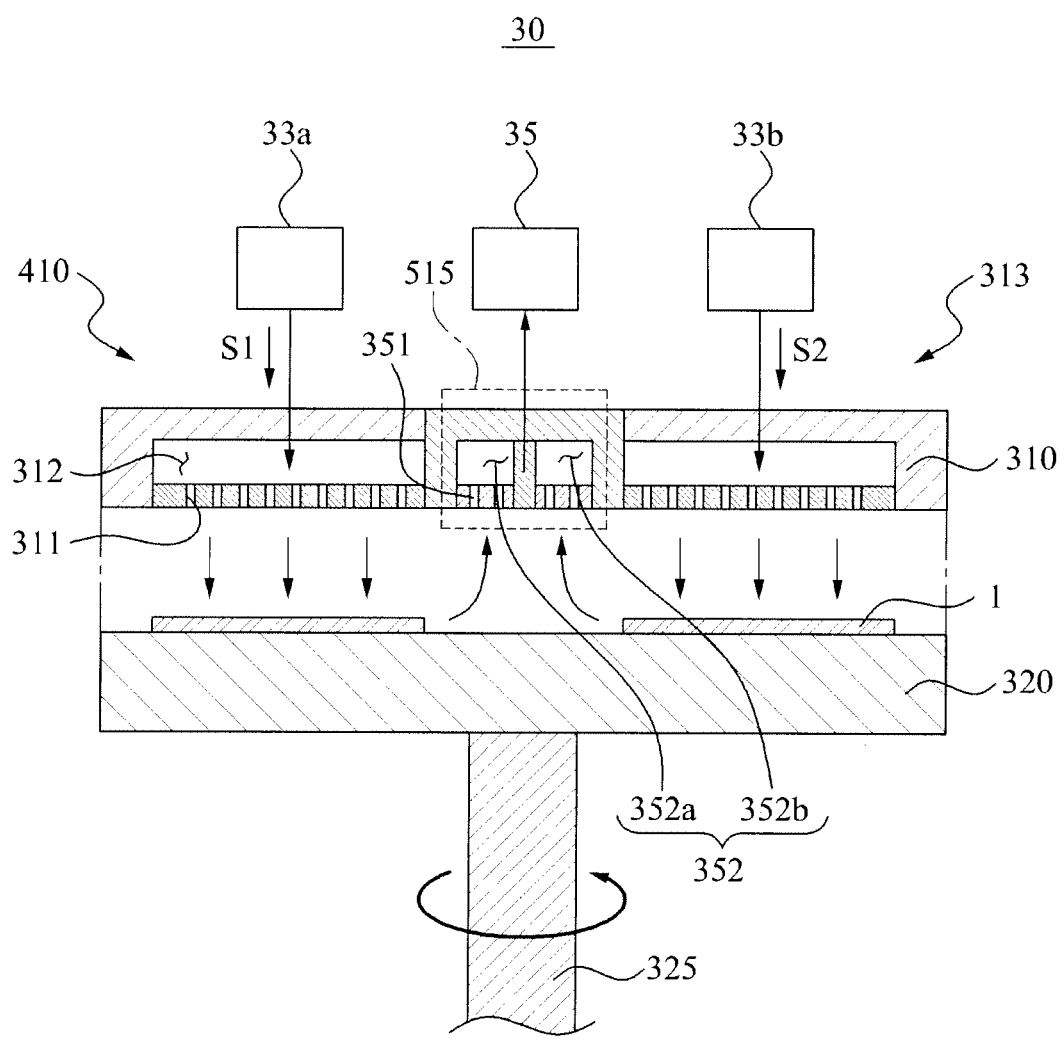
FIG. 7 is a cross-sectional view taken along line I-I in the gas spraying unit of FIG. 6.
Figure 8:
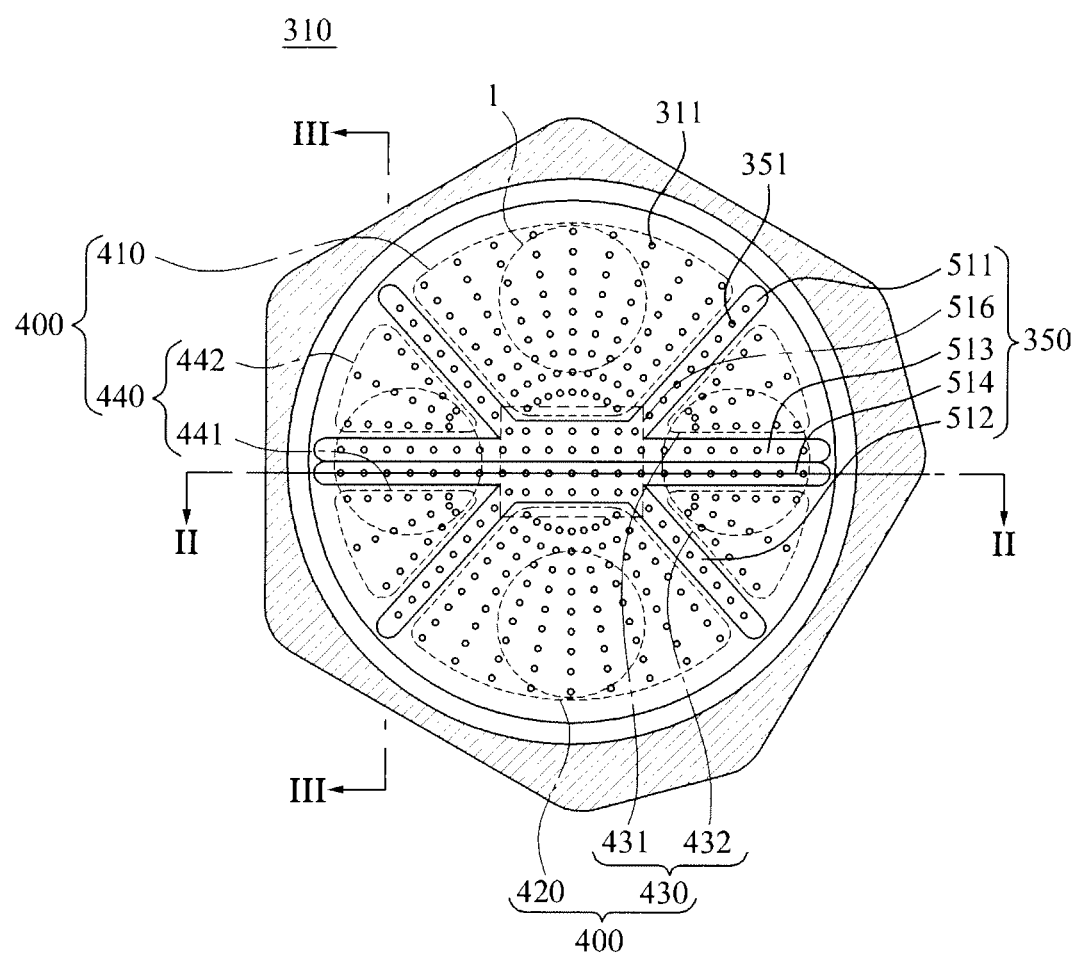
FIG. 8 is a plane view illustrating the gas spraying unit of FIG. 6 according to other exemplary embodiments herein.
Figure 9:
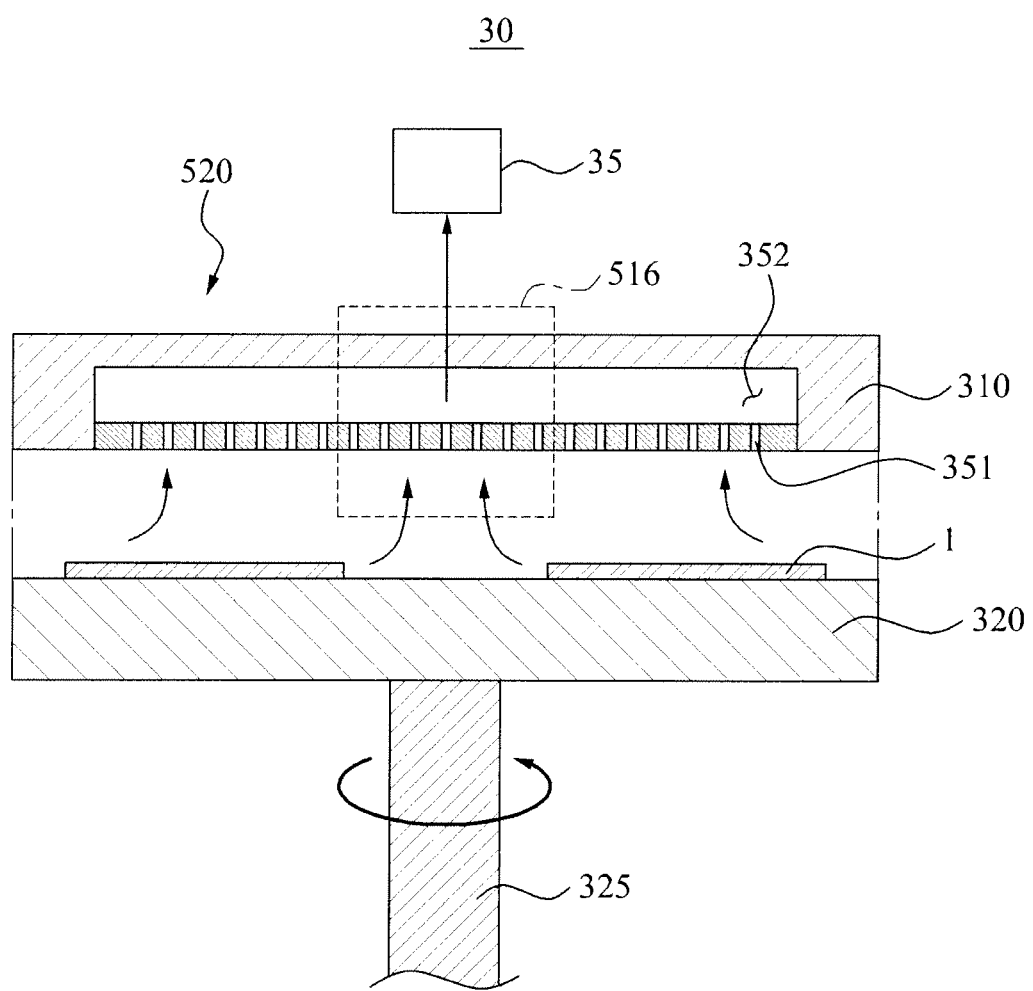
FIG. 9 is a cross-sectional view taken along line II-II in the gas spraying unit of FIG. 8.

FIG. 6 is a plane view illustrating the gas spraying unit 310 in the process module 30 of FIG. 5, FIG. 7 is a cross-sectional view taken along line I-I in the gas spraying unit 310 of FIG. 6, FIG. 8 is a plane view illustrating the gas spraying unit of FIG. 6 according to other exemplary embodiments herein, FIG. 9 is a cross-sectional view taken along line II-II in the gas spraying unit 310 of FIG. 8, and FIG. 10 is a cross-sectional view taken along line III-III in the gas spraying unit 310 of FIG. 8.

For example, as illustrated in FIG. 6, each of the plurality of spraying regions 400 of the gas spraying unit 310 may be formed into a fan-shape, and the plurality of spraying region 400 may be divided into a first source region 410 where a first source gas is sprayed, a first purge region 430 where a purge gas is sprayed, a second source region 420 where a second source gas is sprayed, and a second purge region 440 where the purge gas is sprayed, along a movement direction of the substrates 1. In this instance, four different types of gases are respectively sprayed via the plurality of spraying regions 400.

The gas spraying unit 310 may include a plurality of spraying holes 311 where the deposition gases are sprayed, and a spraying buffer 312, that is, a flow path by which the deposition gases are supplied to the plurality of spraying holes 311. Also, a deposition gas supplying unit 33 may be provided in a side of the spraying buffer 312 and adopted for supplying the deposition gas to the spraying buffer 312. For example, the deposition gas supplying unit 33 includes a first supplying portion 33a for supplying the first source gas (S1), a second supplying portion 33b for supplying the second source gas (S2), and a third supplying portion 3c for supplying the PG.

Here, so that the gas spraying unit 310 uniformly provides the deposition gas to the substrates 1, the plurality of spraying holes 311 may be formed in a predetermined pattern. Also, the plurality of spraying holes 311 may be formed such that a trace of the sprayed deposition gas is linearly brought into contact with the substrates 1 when the substrates 1 are moved by rotation of the susceptor unit 320 to cover the entire surface of the substrates 1. For example, the plurality of spraying holes 311 may be arranged in a linear type that is approximately perpendicular to the movement direction of the substrates 1, so that the substrates 1 and the deposition gas sprayed from the plurality of spraying holes 311 may be crossed with each other in the linear type, thereby uniformly maintaining a period during which the deposition gas is in contact with the surface of the substrates 1. However, embodiments as illustrated in the accompanying drawings are non-limiting and thus, a size and an arranged type of the plurality of spraying holes 311 may be practically and diversely changed.

The gas spraying unit 310 may include the plurality of spraying regions 400, defined as the plurality of spraying holes 311 via which the deposition gases are sprayed to the substrates 1, in accordance with a number of deposition gases. For example, the plurality of spraying regions 400 may be divided into the first and second source regions 410 and 420 via which the first and second source gases S1 and S2 are sprayed, respectively, and two purge regions 430 and 440 via which the PG is sprayed. In this instance, the two purge regions 430 and 440 may be provided between the first and second source regions 410 and 420, respectively. As illustrated by dotted lines of FIG. 6, the plurality of spraying regions 400 may be formed into a fan-shape that may divide the gas spraying unit 301 into approximately four parts.

The gas spraying unit 310 may be connected with an exhaust unit 35 for drawing in/exhausting an exhaust gas inside the process chamber 31, and include an exhaust portion 350 for drawing in the exhaust gas from above the substrates 1 in the process chamber 31 and exhausting the exhaust gas to the outside. The exhaust portion 350 includes a plurality of exhaust lines 511 and 512 having a plurality of exhaust holes 351 for drawing in the exhaust gas inside the process chamber 31, and an exhaust buffer 352, that is, a flow path of the exhaust gas drawn in from the plurality of exhaust holes 351.

Here, the plurality of exhaust lines 511 and 512 may be defined as the plurality of exhaust holes 351 formed along a boundary of the plurality of spraying regions 400, and may function to divide the plurality of spraying regions 400 as well as to draw in the exhaust gas via the plurality of exhaust holes 351 and to exhaust the exhaust gas. For example, the exhaust portion 350 may be formed along the boundary of each of the plurality of spraying regions 400, so that two exhaust lines 511 and 512 are formed in a 'U-shape' or a '⊏-shape' to divide the gas spraying unit 310 into approximately four regions. Here, the exhaust portion 350 may include two exhaust lines 511 and 512 formed into a 'V-shape', which are linear-symmetrical to each other. In this instance, the two exhaust lines 511 and 512 may serve as a physical barrier for preventing the source gases from being mixed between the source regions 410 and 420 while ensuring a maximal area of the source regions 410 and 420. Also, vertexes of the 'V-shape' facing each other may be located in a center portion of the gas spraying unit 310.

In addition, a size, a number, and an arranged type of the plurality of spraying holes 311 are not limited to embodiments as illustrated in the accompanying drawings and thus, the plurality of spraying holes 311 may be practically and diversely arranged to uniformly spray the deposition gases to the substrates 1. Also, the plurality of spraying holes 311 may be formed into a circular-shape or a slit-shape. Similarly, a size, a number, and an arranged type of the plurality of exhaust holes 351 are not limited to embodiments as illustrated in the accompanying drawings and thus, the plurality of exhaust holes 351 may be practically and diversely arranged.

In particular, the exhaust portion 350 may include the plurality of exhaust lines 511 and 512 for preventing the source gases S1 and S2 from being mixed between the first and second source regions 410 and 420, which are adjacent to each other in the center portion of the gas spraying unit 310, in characteristics in the form of plurality of spraying regions 400. Hereinafter, the exhaust portion 350 may include a center exhaust block 515 or 516 formed such that the exhaust lines 511 and 512 are adjacent to each other in the center portion of the gas spraying unit 310, and the center exhaust block 515 or 516 is illustrated as a dotted line box in FIGS. 6 and 8.

Here, the center exhaust block 515 may be defined as a portion of the exhaust lines 511 and 512 formed in the center portion of the gas spraying unit 310, and may be connected with the exhaust lines 511 and 512. However, unlike the above, the center exhaust block 515 may have the exhaust buffer 352 formed separately from the exhaust lines 511 and 512. Here, being connectively formed between the exhaust lines 511 and 512 with the center exhaust block 515 may designate being communicatively formed between a buffer where an exhaust gas drawn in via the exhaust lines 511 and 512 is exhausted and a buffer where an exhaust gas drawn in via the center exhaust block 515 is exhausted. In addition, as illustrated in FIG. 6 or 8, the exhaust lines 511 and 512 and the center exhaust block may be connectively formed.

In addition, since the exhaust gas includes a non-reacted source material, the exhaust gases drawn in from the first and second source regions 410 and 420, respectively, are mixed and reacted inside the exhaust buffer 352 to thereby generate particles. Accordingly, the first and second source regions 410 and 420 may need to be formed to exhaust the exhaust gases via the exhaust lines 511 and 512, each having a separate flow path. However, since the PG is not chemically reacted with the first and second source gases S1 and S2, the purge regions 430 and 440 may exhaust the exhaust gases using the same exhaust lines 511 and 512 as those in the first source region 410 or the second source region 420. According to the present exemplary embodiment, the first exhaust line 511 for drawing in exhaust gases from the first source region 410 and the purge regions 430 and 440, and the second exhaust line 512 for drawing in exhaust gases from the second source region 420 and the purge regions 430 and 440 may be provided. Also, as illustrated in FIG. 7, as for the center exhaust block 515, the exhaust buffers 352a and 352b may be partitioned inside the center exhaust block 516, so that the exhaust gases drawn in from the first source region 410 and the second source region 420, respectively, are not mixed.

Here, due to characteristics in the form of the plurality of spraying regions 400 and the gas spraying unit 310, the first source region 410 and the second source region 420 may be adjacent to each other in the center portion of the gas spraying unit 310. However, according to the present exemplary embodiment, the center exhaust block 515 is formed in the center portion of the gas spraying unit 310, so that a physical barrier between the first and second source regions 410 and 420 is formed by means of the center exhaust block 515 in the center portion of the gas spraying unit 310 to thereby prevent inflow and mixing of the first and second source gases S1 and S2.

In addition, as illustrated in FIG. 5, in a process where an exhaust gas above the suscepor unit 320 flows in towards a center portion (CA) of the susceptor unit 320 when the susceptor unit 320 is rotated in a high-speed, a vortex of the exhaust gases may be generated, causing a stagnancy phenomenon of the exhaust gases. Here, the center portion (CA) of the susceptor unit 320 may be defined as a region where a vortex of gases is generated while the exhaust gases flow in, and may approximately designate a region where the substrates 1 are not seated on the susceptor unit 320.

The center exhaust block 515 may increase an exhaust quantity of the exhaust gas from the center portion (CA) of the susceptor unit 320 where the vortex and stagnancy phenomenon of the exhaust gas are generated, thereby preventing the vortex and stagnancy phenomenon of the exhaust gas from being generated.

More specifically, as for the center exhaust block 515, the plurality of exhaust holes 351 are formed in the center portion of the gas spraying unit 310 corresponding to the center portion (CA) of the susceptor unit 320, thereby increasing the exhaust quantity of the exhaust gas from the center portion (CA) of the susceptor unit 320. Also, the two exhaust lines 511 and 512 formed along the boundary of the plurality of spraying regions 400 may be adjacent to each other in the center portion of the gas spraying unit 310, and the center exhaust block 515 may be formed such that the plurality of exhaust holes 351 are disposed over an entire region corresponding to the center portion (CA) of the susceptor unit 320. For example, the center exhaust block 515 may be formed in the center portion of the gas spraying unit 310, as illustrated in FIG. 6 and FIG. 8, in a linear type having a predetermined length. Also, the center exhaust block 515 may have a more expanded type than the exhaust lines 511 and 512 to correspond to a size of the center portion (CA) of the susceptor unit 320.

However, embodiments as illustrated in the accompanying drawings are non-limiting and thus, a type and location of the exhaust lines 511 and 512 and the center exhaust block 515 may be practically and diversely changed.

In addition, to increase the exhaust quantity in the exhaust lines 511 and 512, an area of the exhaust lines 511 and 512 and a number of the plurality of exhaust holes 351 may need to increase.

Referring to FIGS. 8 to 10, according to other exemplary embodiments of the present invention, the gas spraying unit 310 including the exhaust lines 511 and 512 of which an area increases is exemplarily illustrated. The other exemplary embodiments, which will be described in detail below, may be practically the same as the above described exemplary embodiments, except for a type of the exhaust lines 511 and 512. Thus, like reference numerals may refer to the like elements throughout, and repeated descriptions will be omitted.

As illustrated in FIGS. 8 to 10, the exhaust portion 350 may include the exhaust lines 511 and 512 formed along the boundary of the plurality of spraying regions 400, and the center exhaust block 516 formed in the center portion of the gas spraying unit 310 and adopted for drawing in/exhausting an exhaust gas in the center portion (CA) of the susceptor unit 320.

Also, the exhaust portion 350 may include two exhaust lines 511 and 512 formed into a 'U-shape' or '⊏-shape' while the two exhaust lines 511 and 512 roughly divide the gas spraying unit 310 into four regions, and two auxiliary exhaust blocks 513 and 514 may also include traversing the gas spraying unit 310 along a diameter direction of the gas spraying unit 310. The two exhaust lines 511 and 512 are formed to thereby prevent exhaust gases drawn in from the first and second source regions 410 and 420 from being mixed, and the two auxiliary exhaust blocks 513 and 514 may be formed traversing the purge regions 430 and 440.

Here, when a sprayed pressure of the PG is high, the first and second gases S1 and S2 may be heavy in one direction, and thereby a thickness of a film deposited on the substrates 1 may be non-uniformly generated. The auxiliary exhaust blocks 513 and 514 may be formed in the purge regions 430 and 440, thereby adjusting the sprayed pressure of the purge gas (PG).

In addition, regions 431, 432, 441, and 442 not described in FIG. 8 designate regions where the purge regions 430 and 440 are respectively partitioned by the auxiliary exhaust blocks 513 and 514.

The exhaust lines 511 and 512 may be connected with the auxiliary exhaust blocks 513 and 514, or may be formed separately from each other. However, the exhaust lines 511 and 512 and the auxiliary exhaust blocks 513 and 514 may be formed to prevent the exhaust gases drawn in from the first and second source regions 410 and 420 from being mixed.

The gas spraying unit 310 may include the plurality of exhaust holes 351 which is densely arranged in the center portion of the gas spraying unit 310, and the center exhaust block 516 for drawing in the exhaust gas from the center portion (CA) of the susceptor unit 320. The center exhaust block 516 may be formed communicatively with or separately from the exhaust lines 511 and 512 and the auxiliary exhaust blocks 513 and 514. However, at least two center exhaust block 516 may be formed to prevent the exhaust gases drawn in from the first and second source regions 410 and 420 from being mixed, and the two center exhaust blocks 516 may include exhaust buffers 352a and 352b, each having a separate flow path.

The susceptor unit 320 and the heater unit 330 according to exemplary embodiments will be described in detail with reference to FIGS. 11 to 14.

Figure 11:
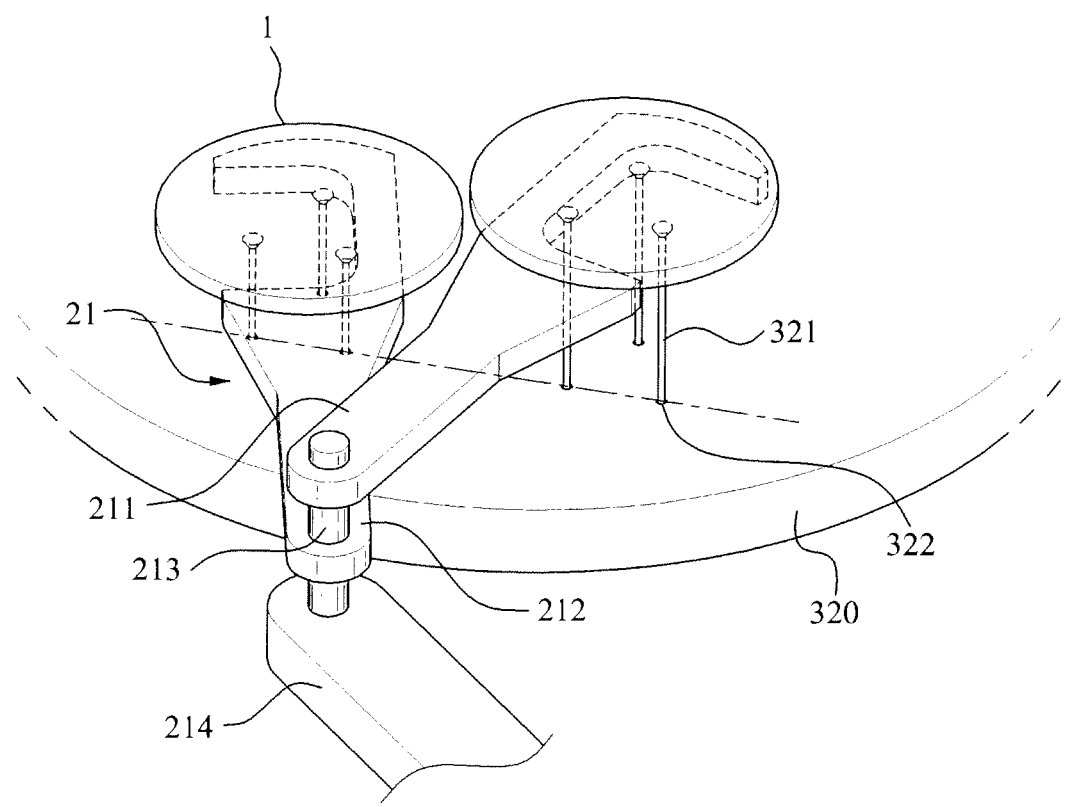
FIG. 11 is a perspective view of a main part for describing an operation in which a transfer robot loads a substrate on a susceptor unit in the atomic layer deposition apparatus of FIG. 1.
Figure 12:
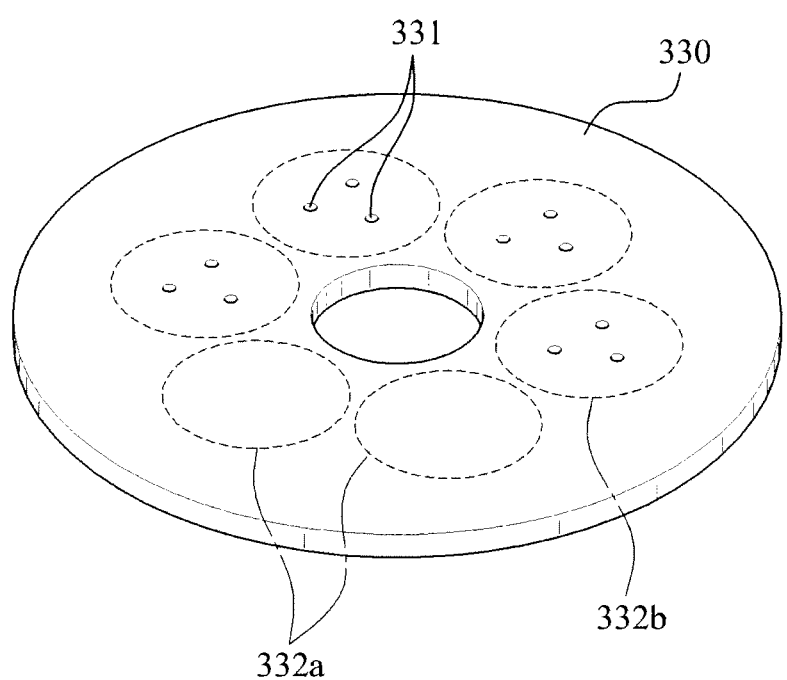
FIG. 12 is a perspective view illustrating a heater unit of the process module of FIG. 4.
Figure 13:
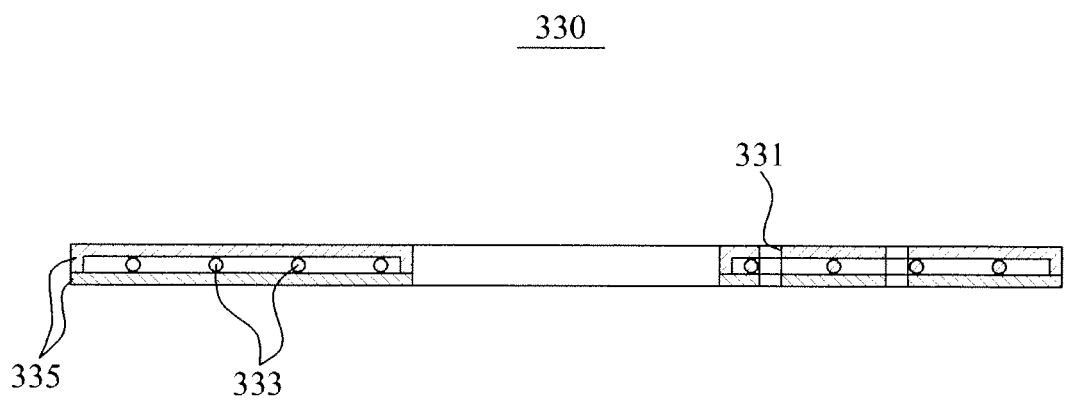
FIG. 13 is a cross-sectional view illustrating the heater unit of FIG. 12.
Figure 14:
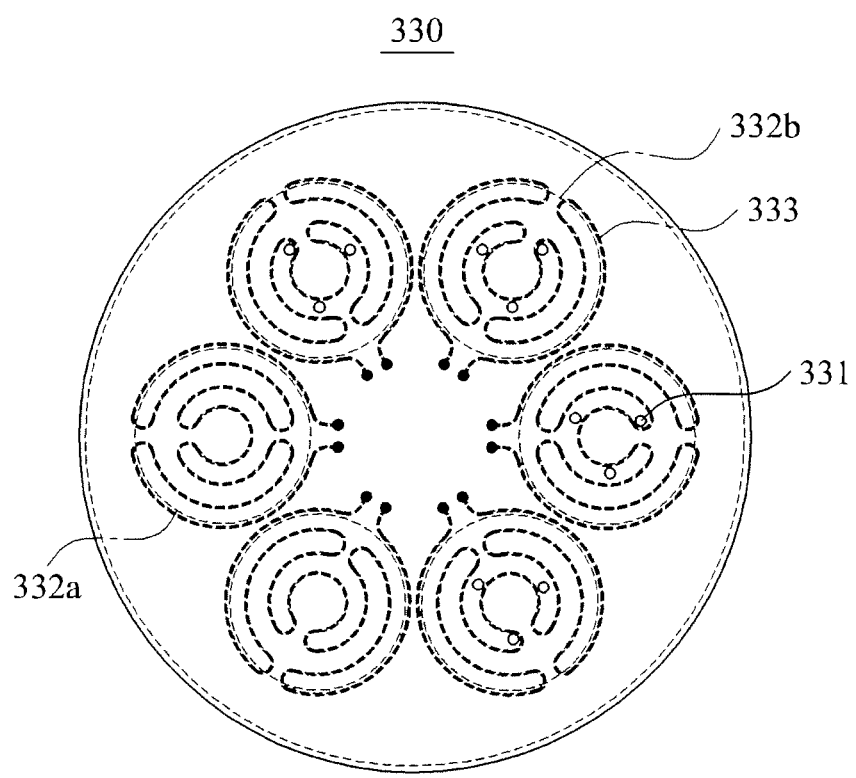
FIG. 14 is a plane view for describing an example of a pattern of a heating device in the heater unit of FIG. 12.

FIG. 11 is a perspective view of a main part for describing an operation in which the transfer robot 21 loads substrates on the susceptor unit 320 in the atomic layer deposition apparatus of FIG. 1, FIG. 12 is a perspective view illustrating the heater unit 330 of the process module 30 of FIG. 4, FIG. 13 is a cross-sectional view illustrating the heater unit 330 of FIG. 12, and FIG. 14 is a plane view for describing an example of a pattern of a heating device 333 in the heater unit 330 of FIG. 12.

The susceptor unit 320 may be a semi-batch type having an excellent throughput, and the plurality of substrates 1 may be radially disposed along a circumferential direction of the susceptor unit 320 while being horizontally seated on an upper surface of the susceptor unit 320. For example, six pieces of the substrates 1 may be seated on the upper surface of the susceptor unit 320 by predetermined intervals, and the substrates 1 may be resolved with respect to a center point of the susceptor unit 320 when the susceptor unit 320 is rotated. The susceptor unit 320 may include a driving shaft 325 formed in a lower portion of the susceptor unit 320. The driving shaft 325 may be adopted for enabling the susceptor unit 320 to be rotated and also enabling vertical movement of the susceptor unit 320 when loading/unloading the substrates 1.

The susceptor unit 320 may include a plurality of lift pins 321 on which the substrates are seated. For example, a single piece of the substrate 1 may be supported by three lift pins 321, that is, by triangular three points, and three lift pins 321 may be provided in every location where the substrates 1 are seated.

The substrates 1 may not be seated on the upper surface of the susceptor unit 320, and may be seated on the plurality of lift pins 321, protruded from the upper surface of the susceptor unit 320 by a predetermined height, when loading the substrates 1, as illustrated in FIG. 11. Next, the substrates 1 may be seated on the upper surface of the susceptor unit 320 when the plurality of lift pins 321 descends.

The plurality of lift pins 321 may be formed passing through the susceptor unit 320 and may be vertically moved by vertical movement of the susceptor unit 320.

More specifically, as illustrated in FIG. 4, the susceptor unit 320 may downwardly descend to a location where a lower surface of the susceptor unit 320 is relatively close to the heater unit 330 when loading/unloading the substrates 1. Since the plurality of lift pins 321 pass through the susceptor unit 320 and are extended to a lower portion of the susceptor unit 320 by a predetermined length, a bottom of the lift pin 321 may be in close contact with an upper surface of the heater unit 330 when the susceptor unit 320 descends, and thereby and the lift pin 321 may be protruded above the susceptor unit 320 by a predetermined height due to restriction of movement of the lift pin 321. Also, when the susceptor unit 320 ascends for the deposition process, the lift pin 321 may be downwardly moved due to an unladen weight of the lift pin 321 and thus, the substrates 1 may be seated on the surface of the susceptor unit 320 (see FIG. 5). Here, to prevent the lift pin 321 from being erroneously dropped to the lower portion of the susceptor unit 320, a part of an upper portion of the lift pin 321 may be formed to have a diameter greater than that of a pin guide hole 331 of the heater unit 330 and thus, the upper portion of the lift pin 321 may be latched on the pin guide hole 331.

In addition, in a case where the plurality of lift pins 321 are vertically moved when loading/unloading the substrates 1 on the susceptor unit 320, the substrate 1 having been already loaded may be separated/erroneously dropped from its loaded/unloaded position due to the movement of the lift pin 321 and thus, the lift pin 321 may ascend only with respect to two substrates 1 corresponding to the loaded/unloaded position of the substrates 1. That is, the vertical movement of the lift pin 321 may be carried out depending on whether the susceptor unit 320 is in close contact with the heater unit 330 when being vertically moved and thus, the heater unit 330 may include the pin guide hole 331 passing through the heater unit 330 to prevent the vertical movement of the lift pin 321.

Here, for convenience of description, a position corresponding to the two substrates 1 loaded/unloaded by the transfer robot 21 in the doorway 301 may designate a loaded position 332a, and a position corresponding to remaining four substrates 1 may designate a seated position 332b. As illustrated in FIG. 12, the pin guide hole 331 to allow the lift pin to the protruded therethrough may not be formed in the loaded position 332a of the heater unit 330, however, the pin guide hole 331 may be formed in the remaining seated position 332b, the lower portion of the lift pin 321 may be downwardly moved through the pin guide hole 331 when the susceptor unit 320 descends, and thereby the lift pin 321 may be prevented from being protruded.

The transfer robot 21 may load/unload two pieces of substrates 1 per each time, and six pieces of substrates 1 may be seated on the susceptor unit 320 and thus, the susceptor unit 320 may load/unload two pieces of substrates 1 per each time when being rotated at intervals of 120 degrees. Here, when the susceptor unit 320 is rotated in a state where the lift pin 321 is received in the pin guide hole 331 of the heater unit 330, the lift pin 321, the susceptor unit 320, and the heater unit 330 may be damaged. Thus, so that the lift pin 321 is completely separated from the pin guide hole 331 when the susceptor unit 330 is rotated, the susceptor unit 320 is rotated in a state of ascending, the lift pin 321 of the loaded positions 332a is protruded to enable the substrates 1 to be loaded/unloaded, and the lift pin 322 of the remaining seated positions 332b is received in the pin guide hole 331 to maintain a seated state of the substrates 1.

Also, since two pieces of the substrates 1 are loaded/unloaded in different heights due to a difference of heights of the handling arms 211 and 221 of the transfer robot 21, the lift pin 321 of the loaded positions 332a may be protruded in different heights to conform to the heights of the loaded substrates 1. These two pin lengths are shown in FIG. 11, and in the sectioned projection view of FIG. 4 where the long pin 321 lengths are seen at the loaded positions (e.g. where the wafer positions are shown on the left-hand side of the process chamber 31 in FIG. 4) with the shorter pins hidden directly behind them. The shorter pins can be seen at the right side of the process chamber 31 (e.g. at the seated positions) and partially hide the longer pins located behind them in FIG. 4. With no pin guide holes 331 located at the loaded positions, the pins cannot fully descend when the susceptor unit 320 moves downward and instead bear against the top surface of heater unit 330. As shown in FIG. 11, both the long pins and shorter pins at the loaded positions project above the susceptor unit 320 top surface to accept the wafers 1 from the different-heighted robot arms 211, 213. Pin guide holes 331 are located in the seated positions of the heater unit 330 and therefore allow the pins 321 to fully descend with the susceptor unit 320 so that the wafer 1 rests on the susceptor unit surface.

In addition, the transfer robot 21 may simultaneously load two pieces of substrates 1 to the susceptor unit 320, and the lift pin 321 may be disposed in a predetermined pattern to securely load/unload the substrates 1. For example, the handling arms 211 and 212 may be disposed to be moved in a perpendicular manner to a base of a triangle formed by the lift pin 321. Also, to prevent the substrates 1 from colliding or interferences from being generated when the two pieces of the substrates are simultaneously loaded/unloaded, or when the handling arms 211 and 212 are inwardly/outwardly moved, the lift pin 321 provided on the two loaded locations 332a may be disposed in a predetermined type.

For example, six lift pins 321 of the loaded locations 332a may be provided in a regular triangle type or in an isosceles triangle type, and bases of two triangles formed by the six lift pins 321 may be formed to be disposed on a predetermined imaginary line (illustrated as a dashed dot line of FIG. 11).

The heater unit 330 may be mounted below the susceptor unit 320, and may heat the susceptor unit 320 and the substrates 1 at a temperature required for the deposition process.

The heater unit 330 may include a heating element 333 for generating a heat when a power is applied, and the heating element 333 may be embedded in a housing 335 of the heater unit 330. The heating element 333 may be embedded in the housing 335 and thus, the heater unit 330 may be exposed to the deposition gas while the deposition process is carried out, and thereby may prevent a lifetime of the heater unit 330 from being reduced due to oxidization/damage of the heater unit 330 by the deposition gas, or prevent a temperature dispersion from being non-uniformly provided due to precipitation of impurities on the heater unit 330. Here, to prevent inflow of the deposition gas to inside the housing 335 from being blocked and to effectively transmit a heat generated by the heating element 333 to the susceptor unit 320, an interior of the housing 335 may be maintained in a vacuum state or a high-vacuum state.

The housing 335 may be formed to block transmission of the heat to a lower portion of the heater unit 330 while effectively transmitting the heat emitted from the heating element 333. For example, the housing 335 may be made of a chemically stable material while not causing a deformation of the housing 335 due to the heat generated in the heating element 333. For example, the housing 335 may be made of a silicon nitride ceramic, a carbide ceramic, or a graphite material.

Also, a shielding member (not illustrated) may be provided in a lower portion of the housing 335, that is, a portion of the housing 335 facing a lower portion of the heater unit 330, to shield the heat generated in the heating element 333 from being transmitted to the lower portion of the heater unit 330. Here, the shielding member may be provided in the lower portion of the housing 335, or the lower portion of the housing 335 may be made of a material enabling heat shielding, and thereby prevent structures provided in the lower portion of the heater unit 330 from being thermally deformed by the heat generated in the heating element 333, and the heat may be emitted only to the susceptor unit 320 to improve heat transfer efficiency of the heater unit 330.

The heating element 333 may be a predetermined resistant heating element of heating a heat when a power is applied, and may have a wire type to be disposed in a predetermined type, thereby uniformly heating the substrates 1 inside the housing 335.

For example, the element 333 may include a filament, a coil, or a carbon wire.

The heating element 333 may be disposed in a curved line type so that a temperature of the substrates 1 may be uniformly heated and maintained. Also, the heating element 333 may be disposed over the heater unit 330, however, may be provided in regions corresponding to each of the substrates 1, as illustrated in 14, to more accurately and uniformly heat the temperature of the substrates 1, thereby forming a plurality of heating regions (for example, six heating regions).

In FIG. 14, a pattern and a disposed type of the heating element 333 are illustrated. As illustrated in FIG. 14, six heating elements 333 may be separately provided in the regions corresponding to each of the substrates 1 to thereby form six heating regions. In this case, since the six regions are heated by each of the heating elements 333, a temperature of each of the six regions may be uniformly heated to thereby uniformly maintain a temperature dispersion. Also, by adjusting a power applied to each of the heating elements 333, the temperature of the heating element 333 may be partially controlled.

Here, since the heating element 333 may have a wire type that enables the heating element 333 to be freely transformed, the heating element 333 may be formed into a shape that enables avoiding the structures and uniformly heating the substrates 1, so that interferences with a structure inside the heater unit 330 and the pin guide hole 331 may be prevented from being generated.

In addition, the heating element 333 may include a terminal portion (not illustrated) used for connection with a power supplying portion (not illustrated), and the heating element 333 may be formed to minimize a number of the terminal portions.

However, the present invention is not limited thereto. Thus, the heating element 333 may have a predetermined curved-line type or an arbitrary adjustable curved-line type, and also have various shapes such as a spiral shape, a concentric circle, a linear shape, and the like.

Although a few exemplary embodiments have been shown and described, it would be appreciated by those skilled in the art that changes may be made in these exemplary embodiments without departing from the principles and spirit of the disclosure, the scope of which is defined in the claims and their equivalents.

What is claimed is:

1. An atomic layer deposition apparatus, comprising:
    a loading/unloading module for loading/unloading a substrate;
    a process module including a plurality of process chambers for simultaneously receiving a plurality of substrates and performing a deposition process, each of the plurality of process chambers including a gas spraying unit having an exhaust portion by which an exhaust gas is drawn in from inside the process chamber and the drawn in gas is exhausted above the process chamber; and
    a transfer module including a transfer robot provided between the loading/unloading module and the process module, the transfer robot being adapted for simultaneously loading at least two of the plurality of substrates into a common one of the plurality of process chambers, the common one of the plurality of process chambers including:
    a susceptor unit having a common susceptor surface with a plurality of loaded positions and seated positions, each of the positions adapted to support a substrate, the susceptor surface being rotatably provided to allow the plurality of substrates to be laterally seated/supported on the common surface and revolved;
    a plurality of lift pins provided on the susceptor unit to allow the substrate to be seated on the lift pins, a first set of lift pins corresponding to one of the loaded positions having a first length and a second set of the lift pins corresponding to a second one of the loaded positions having a second length different from the first length whereby the lift pins are configured to protrude at different heights from the common susceptor surface to accept the at least two of the plurality of substrates from the transfer robot;
    a heater unit provided on a lower portion of the susceptor unit and adopted for heating the substrate and the susceptor unit, the heater unit including pin guide holes formed adjacent the seated positions for the substrates and no pin guide holes adjacent the loaded positions for the substrates;
    the loading/unloading module includes a load port in which the plurality of substrates are stored and a buffer; and
    the buffer disposed at a side of the transfer module to which the load port is not connected is provided to store a plurality of substrates, and is disposed at a side of the transfer module for the transfer robot to transport the substrates in the buffer providing the same number of the substrates as a number of substrates that are lacking when loading the substrate for a number of substrates stored in the load port and a number of substrates received in the process chamber to be multiples of one another.

2. The atomic layer deposition apparatus of claim 1, wherein the buffer is provided in a side of the transfer module, and an internal pressure of the buffer is selectively decompressed/pressurized to prevent a vacuum state of the transfer module from being broken when transporting the substrate to the transfer module.

3. The atomic layer deposition apparatus of claim 1, wherein the transfer robot includes a plurality of handling arms, each for holding a single piece of the substrates, and the plurality of handling arms is formed into a bar-shape or a ring-shape, each having a predetermined width and traversing a center portion of the substrate to correspond to a diameter of the substrate, so that the substrate is supported from a lower portion of the substrate.

4. The atomic layer deposition apparatus of claim 3, wherein the plurality of handling arms are vertically overlapped when transporting the substrates, and laterally expanded in a 'V-shape' but at different heights when loading/unloading the substrates on the process chamber, the lift pins protruding at different heights within the chamber to accept a respective substrate from a respective handling arm.

5. The atomic layer deposition apparatus of claim 3, wherein the transfer module includes a sensor for checking whether the substrate is securely seated on the transfer robot, and the sensor checks whether the substrate is securely seated on the transfer robot in a state where the handling arms are laterally expanded in the 'V-shape' to allow the substrates to be partially overlapped.

6. The atomic layer deposition apparatus of claim 1, wherein each process chamber includes:
the susceptor unit being vertically movable in the process chamber;
the gas spraying unit being provided on an upper portion of the susceptor unit and including a plurality of spraying regions having at least one source region where a source gas is sprayed and at least one purge region where a purge gas is sprayed, the plurality of spraying regions being defined as a plurality of spraying hole groups by which a single gas of gases used to deposit a thin film on the substrate is provided;
the exhaust portion being provided on the gas spraying unit and adopted for drawing in the exhaust gas in the process chamber and exhausting the drawn in gas;
the lift pins being vertically movable to be protruded to the upper portion of the susceptor unit by means of a vertical movement of the susceptor unit.

7. The atomic layer deposition apparatus of claim 6, wherein the exhaust portion includes:
an exhaust line provided along a boundary of the plurality of spraying regions in the gas spraying unit, and defined as a plurality of exhaust hole groups by which the exhaust gas in the process chamber is drawn in and exhausted; and
a center exhaust block formed in a center portion of the gas spraying unit and connected with the exhaust line, the center exhaust block being adapted for drawing in and exhausting an exhaust gas in a center portion of the susceptor unit.

8. The atomic layer deposition apparatus of claim 7, wherein the exhaust portion includes at least two exhaust lines formed to exhaust an exhaust gas drawn in from each of the at least one source region through different exhaust buffers of the at least two exhaust lines.

9. The atomic layer deposition apparatus of claim 8, wherein each exhaust line is formed such that the exhaust gas drawn in from one of the at least one source region and an exhaust gas drawn in from one of the at least one purge region are together exhausted through a single exhaust buffer.

10. The atomic layer deposition apparatus of claim 7, wherein the center exhaust block includes an exhaust path for exhausting an exhaust gas drawn in from the center exhaust block, and the exhaust path is connected with or disconnected from an exhaust buffer.

11. The atomic layer deposition apparatus of claim 7, wherein the center exhaust block has a region having a size corresponding to that of the center portion of the susceptor unit.

12. The atomic layer deposition apparatus of claim 7, wherein the center exhaust block is formed such that exhaust gas from each of the at least one source region is exhausted through a different exhaust path.

13. The atomic layer deposition apparatus of claim 7, wherein the exhaust line further includes an auxiliary exhaust block formed thereon to traverse the plurality of spraying regions, and the auxiliary exhaust block includes an exhaust path for exhausting an exhaust gas drawn in from the auxiliary exhaust block, the exhaust path being connected with the exhaust line and the center exhaust block, or being formed separately from the exhaust line and the center exhaust block.

14. The atomic layer deposition apparatus of claim 6, wherein the lift pin is formed in such a manner as to pass through the susceptor unit and to be extended to the lower portion of the susceptor unit, and a lower end of the lift pin is brought into contact with the heater unit when the susceptor unit descends, so that the lift pin is protruded to the upper portion of the susceptor unit, and the lift pin descends by its unladen weight when the susceptor unit ascends.

15. The atomic layer deposition apparatus of claim 14, wherein the heater unit pin guide holes are configured to receive a lower end of the lift pin when the susceptor unit descends, the susceptor unit having a plurality of lift pins associated with each seated position and pin guide holes at seated positions aligned with the pin guide holes of the heater unit so that the lift pins associated with each seated position extend into the pin guide holes of the heater unit and do not protrude from the susceptor surface.

16. The atomic layer deposition apparatus of claim 15, wherein the pin guide holes have a diameter and the lift pins include an upper portion having a diameter greater than that of the pin guide holes of the heater unit so that the upper portion of the lift pins are latched to respective pin guide holes.

17. The atomic layer deposition apparatus of claim 6, wherein the lift pin of loaded positions corresponding to two pieces of loaded/unloaded substrates is protruded in heights different from one another to correspond to a difference in heights where the substrate is loaded/unloaded.

18. The atomic layer deposition apparatus of claim 6, wherein the heater unit includes a heating element of a wire type or a filament type embedded in the heater unit for generating heat when power is applied in a sealed interior of a housing of the heater unit.

19. The atomic layer deposition apparatus of claim 18, wherein the heater unit includes at least one heating element disposed in a curved line-shape, so that a plurality of heating regions is created in locations corresponding to the plurality of substrates.

20. The atomic layer deposition apparatus of claim 1, the transfer robot further including first and second handling arms configured to be rotated with respect to one another to a first angle in a transport position whereby each arm holds a substrate in a vertically overlapped orientation with respect to the other substrate, and configured to be rotated to a second angle in a load/unload position whereby the substrates do not vertically overlap one another.

* * * * *